US007843699B2

(12) United States Patent
Ishii

(10) Patent No.: US 7,843,699 B2
(45) Date of Patent: Nov. 30, 2010

(54) CIRCUIT DEVICE AND METHOD FOR MANUFACTURING THE SAME

(75) Inventor: Tetsurou Ishii, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/655,972

(22) Filed: Jan. 12, 2010

(65) Prior Publication Data

US 2010/0178796 A1 Jul. 15, 2010

(30) Foreign Application Priority Data

Jan. 13, 2009 (JP) ............................ 2009-004848

(51) Int. Cl.
*H05K 1/14* (2006.01)

(52) U.S. Cl. ...................................................... 361/742

(58) Field of Classification Search ......... 361/807–810, 361/742, 758; 439/76.1
See application file for complete search history.

(56) References Cited

U.S. PATENT DOCUMENTS 5,376,014 A 12/1994 Sumida
5,903,439 A * 5/1999 Tamarkin .................... 361/742
6,791,843 B1 * 9/2004 Dobbs et al. ................ 361/758
7,158,384 B2 * 1/2007 Huang ........................ 361/752
7,245,496 B1 * 7/2007 Luo et al. .................. 361/742

FOREIGN PATENT DOCUMENTS

JP 06-140101 5/1994
JP 2002-200947 7/2002

* cited by examiner

*Primary Examiner*—Phuong K Dinh
(74) *Attorney, Agent, or Firm*—Harness, Dickey & Pierce, PLC

(57) ABSTRACT

A circuit device includes an element and a base body. The element has a pair of projections on an outer peripheral surface thereof. The base body has an engagement standing part extending in a standing direction. The element is assembled to the base body in a state, where each of contact surfaces of the engagement standing part is in press-contact with a corresponding projection. The engagement standing part has first and second tapered wall parts. The first tapered wall part has a first tapered surface angled by a first angle relative to the standing direction. The second tapered wall part has a second tapered surface angled by a second angle relative to the standing direction. The second angle is smaller than the first angle. One of the pair of projections is in press-contact with at least one of the first and second tapered surfaces to be deformed.

13 Claims, 6 Drawing Sheets

COMPARISON EXAMPLE

COMPARISON EXAMPLE

CIRCUIT DEVICE AND METHOD FOR MANUFACTURING THE SAME

CROSS REFERENCE TO RELATED APPLICATION

This application is based on and incorporates herein by reference Japanese Patent Application No. 2009-4848 filed on Jan. 13, 2009.

BACKGROUND OF THE INVENTION

1. Field of the Invention

The present invention relates to a circuit device that has an element and a method for manufacturing the same.

2. Description of Related Art

A vehicle is provided with various electronic equipments. For example, an air bag system is one of the electronic equipments. In the air bag system, a sensor mounted on the vehicle outputs a signal to an ECU, and the ECU determines collision based on the received signal. When the collision is determined, an air bag mounted on the vehicle is inflated.

The ECU mounted on the vehicle includes a case and a circuit board that is provided with a chip. The circuit board is received within the case of the ECU in order to achieve resistance to climatic conditions and the like. The ECU is connected with an exterior device through a communication connector that is exposed to the exterior from the surface of the case. The communication connector is assembled to the circuit board and is fixed to the case.

There is provided a receiving part that is cut out at a side wall part of the case, which receiving part receives therein the connector. The connector is fitted into the receiving part such that the connector is fixed to the case. In the above, the receiving part is defined by a peripheral edge part of the case, and the peripheral edge part is provided between a pair of projections of the connector. The connector is press-fitted into the peripheral edge part in a state, where the peripheral edge part is positioned between the projections. Also, the peripheral edge part has at least one surface that is angled to form a tapered surface such that the tapered surface is brought into contact with the projection. During the press-fitting of the connector, the tapered surface leads the connector into the case, and the projection of the connector is brought into press-contact with the tapered surface of the peripheral edge part at a predetermined position relative to the peripheral edge part such that the connector is fixed to the case.

In the above, the connector is made of a resin, and the case and the peripheral edge part are made of a metal that is harder than the resin. Thus, when the connector is press-fitted, a contact portion of the projection, which contacts the tapered surface, elastically deforms, and thereby the projection is brought into press-contact with the tapered surface.

Recently, a press-fit terminal is widely used for connection between the connector and the circuit board. Typically, the press-fit terminal includes a column end portion, a contact portion, and a tapered portion. The contact portion has a diameter wider than a diameter of the end portion, and the tapered portion connects the end portion and the contact portion. An electrical conductor is formed at an inner peripheral surface of a through hole that opens at the circuit board. The press-fit terminal is electrically conductive with the electrical conductor of the through hole of the circuit board through the contact portion, and fixes the connector (element) that is connected with the terminal.

The contact portion of the press-fit terminal has an outer diameter greater than an inner diameter of the through hole that opens at the circuit board, and the press-fit terminal is assembled by inserting the end portion into the through hole. As a result, it is difficult to accurately assemble the press-fit terminal at a position in a direction along the depth of the through hole. In other words, accuracy in positioning of the connector connected with the press-fit terminal relative to the circuit board is insufficiently achieved. When the accuracy in the assembly of the connector deteriorates, accuracy of the position of the connector relative to the peripheral edge part of the case varies in the process of assembling the circuit board at a predetermined position within the case. In other words, the thickness of, the tapered surface of the peripheral edge part at a position, at which the projection of the connector is located, varies. When the thickness of the tapered surface is small, the press-contact force exerted between the projection and the tapered surface is small. In contrast, as the thickness of the tapered surface becomes large, the press-contact force becomes large accordingly, and thereby large force is required during the assembly. When the large force is required, the cost required in the assembly of the circuit board to the case also increases.

As above, when the press-fit terminal is employed for assembly of the connector to the circuit board, the force required for the assembly of the connector may vary, and thereby the cost required for the assembly of the circuit board to the case may increase disadvantageously.

SUMMARY OF THE INVENTION

The present invention is made in view of the above disadvantages. Thus, it is an objective of the present invention to address at least one of the above disadvantages.

To achieve the objective of the present invention, there is provided a circuit device that includes an element and a base body. The element has a pair of projections that are spaced apart from each other by a predetermined interval on an outer peripheral surface of the element. The base body has an engagement standing part extending in a standing direction and provided between the pair of projections. The engagement standing part has contact surfaces that face in opposite directions. The element is assembled to the base body in a state, where each of the contact surfaces of the engagement standing part is in press-contact with a corresponding one of the pair of projections. The engagement standing part has a first tapered wall part and a second tapered wall part that is provided on a side of the first tapered wall part. The first tapered wall part has a first tapered surface that is angled by a first inclination angle relative to the standing direction of the engagement standing part. The second tapered wall part has a second tapered surface that is angled by a second inclination angle relative to the standing direction. The second inclination angle is smaller than the first inclination angle. One of the pair of projections is in press-contact with at least one of the first tapered surface and the second tapered surface. The one of the pair of projections is deformed.

To achieve the objective of the present invention, there is also provided a circuit device that includes an element and a base body. The element has a pair of projections, which are spaced apart from each other by a predetermined interval, and which are deformably formed on an outer peripheral surface of the element. The base body has an engagement standing part extending in a standing direction. The engagement standing part has contact surfaces that face in opposite directions. Each of the contact surfaces is in press-contact with a corresponding one of the pair of projections such that the corresponding one of the pair of projections is deformed. The engagement standing part has a first tapered wall part and a second tapered wall part that is provided on a side of the first tapered wall part. The first tapered wall part has a first tapered surface that is angled by a first inclination angle relative to the standing direction of the engagement standing part. The second tapered wall part has a second tapered surface that is angled by a second inclination angle relative to the standing direction. The second inclination angle is smaller than the first inclination angle.

To achieve the objective of the present invention, there is also provided a method for manufacturing a circuit device that has an element and a base body. The element has a pair of projections, which are spaced apart from each other by a predetermined interval, and which are deformably formed at an outer peripheral surface of the element. The base body has an engagement standing part extending in a standing direction. The engagement standing part has a first tapered wall part and a second tapered wall part that is provided at a side of the first tapered wall part. The first tapered wall part has a first tapered surface angled by a first inclination angle relative to the standing direction of the engagement standing part. The second tapered wall part has a second tapered surface angled by a second inclination angle relative to the standing direction. The second inclination angle is smaller than the first inclination angle. In the method, the element is displaced relative to the base body such that the engagement standing part is inserted into a apace defined between the pair of projections. The element is assembled to the base body by causing the engagement standing part to deform one of the pair of projections.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF PREFERRED EMBODIMENTS

A circuit device according to one embodiment of the present invention will be described with reference to accompanying drawings. The one embodiment shows an air bag ECU mounted on a vehicle.

Embodiment

Figure 1:
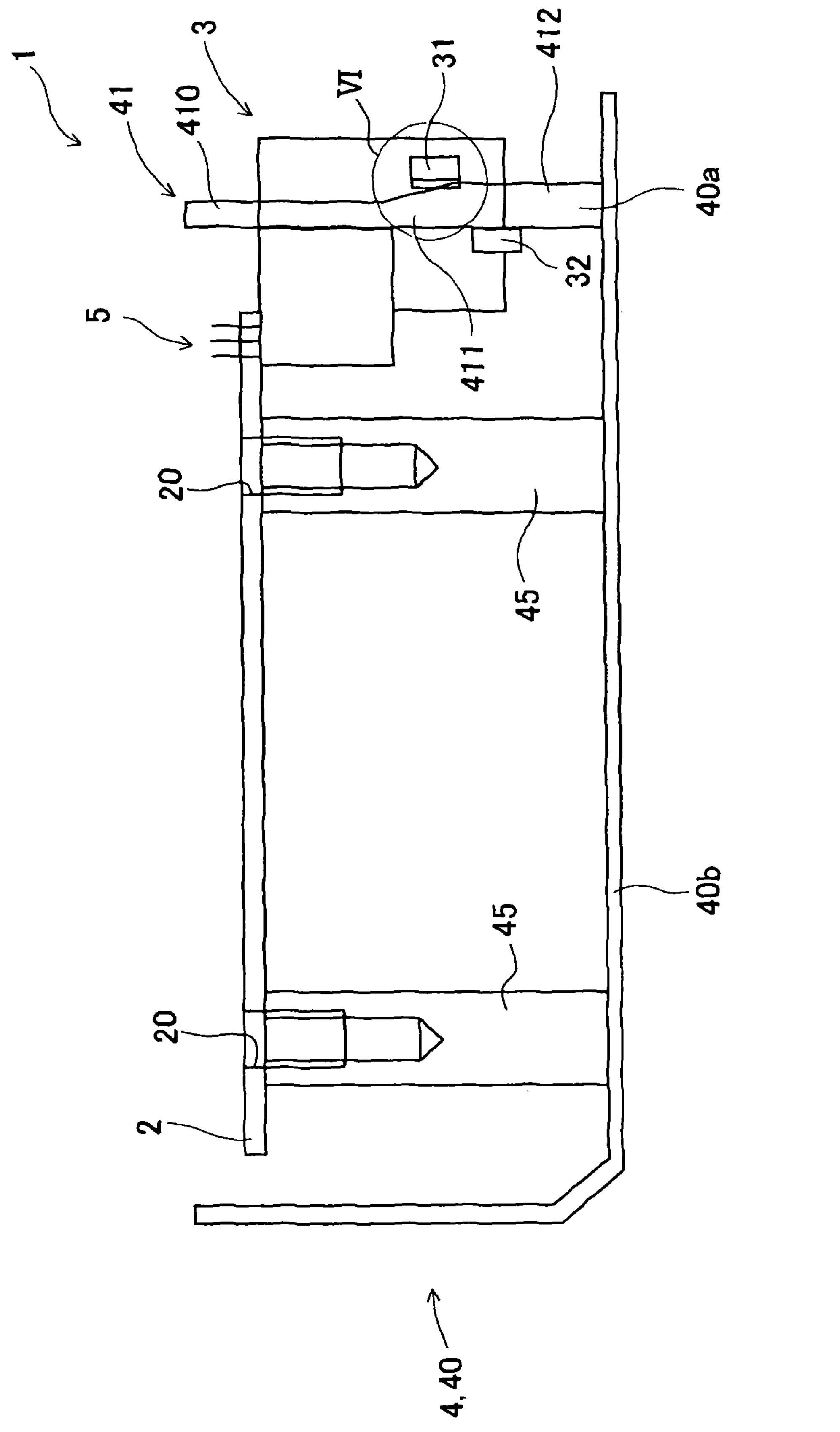
FIG. 1 is a cross-sectional view illustrating a configuration of an air bag ECU according to one embodiment of the present invention.
Figure 2:
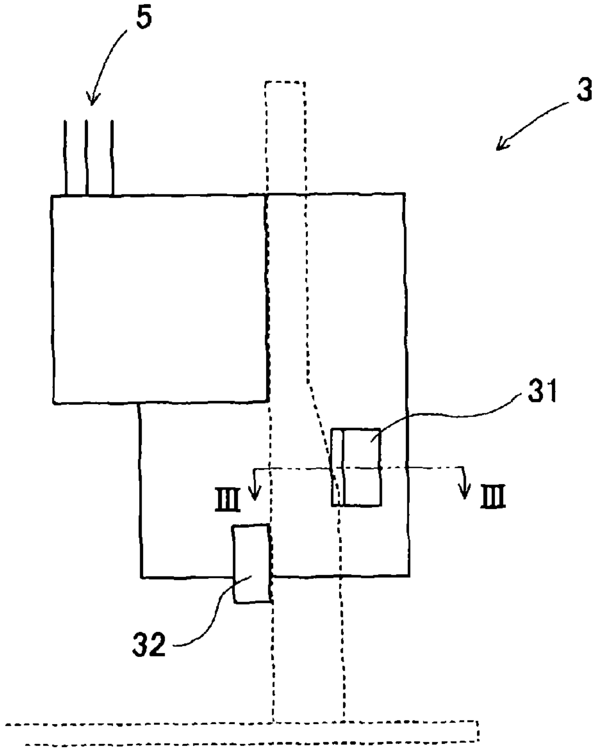
FIG. 2 is a diagram illustrating a communication connector of the air bag ECU of the one embodiment.
Figure 3:
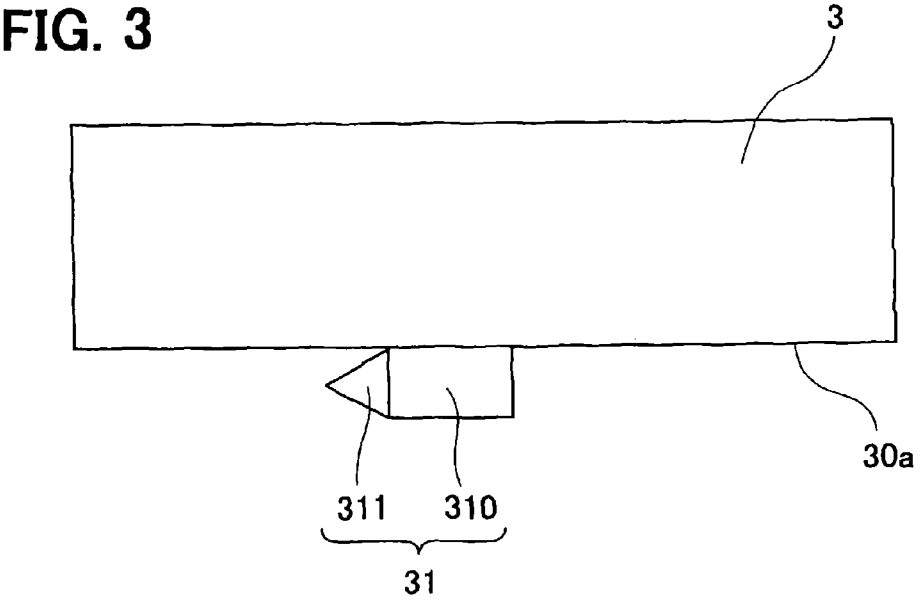
FIG. 3 is a cross-sectional view of a projection of the communication connector of the air bag ECU taken along line in FIG. 2 according to the one embodiment.

An air bag ECU 1 of the embodiment includes a circuit board 2, a communication connector 3, and a case 4. The air bag ECU 1 of the present embodiment is shown in FIGS. 1 through 6. FIG. 1 is a cross-sectional view illustrating a configuration of the air bag ECU 1 of the present embodiment in order to show arrangement of components. FIG. 2 is a diagram illustrating the communication connector 3. FIG. 3 is a cross-sectional view of the communication connector 3 taken along lines III-III of FIG. 2.

The circuit board 2 is a substrate assembled with a processor that conducts computation in the ECU 1. The circuit board 2 is a circuit board employed for a conventional air bag ECU. The circuit board 2 has threaded holes 20 for fixation to the circuit board 2 through threaded members.

The communication connector 3 is connected to the circuit board 2. The communication connector 3 serves as an element that transmits data sets (signals) for computation by the circuit board 2 and drive electric power for the processor. The communication connector 3 is a connector employed by the conventional air bag ECU. The communication connector 3 is made of a resin, such as PBT (polybutylene terephthalate) to have a certain outer peripheral shape.

Figure 4:
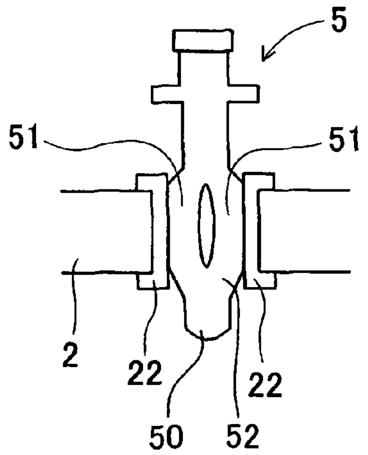
FIG. 4 is a diagram illustrating a configuration of a press-fit terminal.
Figure 5:
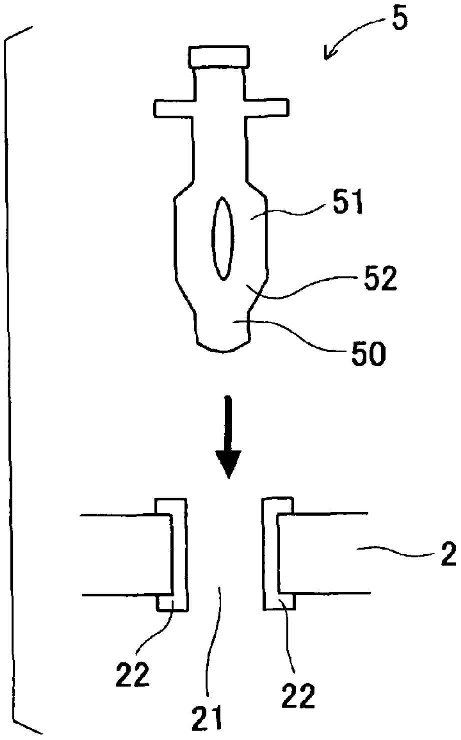
FIG. 5 is a diagram illustrating a method for assembling the press-fit terminal to the circuit board.

The communication between the communication connector 3 and the circuit board 2 is provided by a press-fit terminal 5. The press-fit terminal 5, as shown in FIG. 4, has a column end portion 50, a contact portion 51, and a tapered portion 52. The contact portion 51 has a diameter wider than a diameter of the end portion 50, and the tapered portion 52 connects the end portion 50 to the contact portion 51. As shown in FIG. 5, an electrical conductor 22 is formed at an inner peripheral surface of the through hole 21 that opens at the circuit board 2, and the electrical conductor 22 contacts the contact portion 51 to provide electrical conduction between the press-fit terminal 5 and the electrical conductor 22. The press-fit terminal 5 that connects the communication connector 3 with the circuit board 2 is press-fitted into the through hole 21.

The communication connector 3 is assembled to the case 4 such that the communication connector 3 provides communication between an interior and an exterior of the case 4. The communication connector 3 is generally a tube having a rectangular cross-sectional shape and is provided with a communication element therein. The communication connector 3 has an outer peripheral surface 30*a*, provided with a pair of projections 31, 32 thereon. The projections 31, 32 are arranged such that a peripheral edge part of the case 4 is provided between the projections 31, 32 in a thickness direction of the peripheral edge part. The pair of the projections 31, 32 project from the outer peripheral surface 30*a* in a projection direction perpendicular to the plane of the outer peripheral surface 30*a*, and has a rectangular cross-sectional shape when taken along a plane perpendicular to the projection direction.

The projection 31 is positioned at the exterior of the case 4, and has a main body portion 310 and a deformable part 311. The main body portion 310 projects from the outer peripheral surface 30*a*, and the deformable part 311 projects from the main body portion 310 in a direction toward the case 4. In the above configuration, the deformable part 311 is spaced away from the outer peripheral surface 30*a*. In other words, the deformable part 311 is not directly connected with the outer peripheral surface 30*a*. The deformable part 311 is narrowed toward an end of the deformable part 311, in a direction, in which the deformable part 311 projects, and has a triangular cross-sectional shape as shown in FIG. 3.

The projection 32 is positioned within the case 4, and projects from the outer peripheral surface 30*a*. The case 4 has an engagement standing part 41 (detailed later), which serves as the peripheral edge part provided between the projections 31, 32, and which extends in a standing direction. The projection 32 contacts an inner surface of the engagement standing part 41 and extends along the inner surface. The projection 32 has a generally rectangular outer peripheral shape. The engagement standing part 41 has a first tapered wall part 411 and a second tapered wall part 412. The projection 31 is located at a position such that the deformable part 311 overlaps with the first tapered wall part 411 and the second tapered wall part 412 of the engagement standing part 41 in the standing direction in a state, where the communication connector 3 is assembled to the case 4. However, the main body portion 310 does not overlap with the first tapered wall part 411 and the second tapered wall part 412 in the standing direction of the engagement standing part 41.

In a state, where the communication connector 3 is assembled to the case 4, the pair of the projections 31, 32 are in press-contact with the engagement standing part 41. The term "press-contact" in the present specification means that the projections 31, 32 are in contact with the engagement standing part 41 in a state, where the projections 31, 32 are pressed or urged to the engagement standing part 41. The deformable part 311 deforms (or elastically deforms, for example) when the deformable part 311 is in press-contact with at least one of the first tapered wall part 411 and the second tapered wall part 412.

The case 4 receives therein the circuit board 2. The case 4 is a case employed in the conventional air bag ECU. The case 4 is made of a metal that is harder than a resin used for the outer periphery of the communication connector 3. For example, the metal used for the case 4 may be aluminum or copper (ADC 12).

The case 4 includes a tubular main body portion 40 and a cap portion (not shown). The main body portion 40 has a bottom and receives therein the circuit board 2. The cap portion covers an opening of the main body portion 40. The main body portion 40 of the case 4 has a side wall part 40*a* that is provided with a receiving part, which is assembled with the communication connector 3. The receiving part is a notch that is cut out at the side wall part 40*a* such that the side wall part 40*a* has a generally U-shape that opens toward the opening side of the main body portion 40. Also, the receiving part of the side wall part 40*a* has a shape that corresponds to an outer peripheral shape of the communication connector 3 such that the connector 3 is received by the receiving part formed at the side wall part 40*a*.

More specifically, the main body portion 40 of the case 4 has the bottom wall part 40*b* and the side wall part 40*a*. The bottom wall part 40*b* forms a tubular bottom surface, and the side wall part 40*a* extends perpendicularly in a standing direction from the bottom wall part 40*b*. The side wall part 40*a* has the receiving part that is defined by a peripheral edge part of the side wall part 40*a*. The peripheral edge part has side parts that correspond to both sides of the receiving part in a direction generally parallel to the bottom wall part 40*b*. Each of the side parts corresponds to the engagement standing part 41 and the thickness of each of the side parts changes as a function of a position of the side wall part 40*a* in the standing direction. In other words, the engagement standing part 41 has different thickness at different positions of the engagement standing part 41 in the standing direction.

The engagement standing part 41 has an end portion 410, the first tapered wall part 411, and the second tapered wall part 412. The end portion 410 has a thickness that is constant as a function of a position of the end portion 410 in the standing direction, which the engagement standing part 41 stands or extends. The first tapered wall part 411 is provided at a proximal side of the end portion 410 and is angled by a first inclination angle relative to the standing direction. The second tapered wall part 412 is provided at a proximal side of the first tapered wall part 411 and is angled by a second inclination angle relative to the standing direction. In the present specification, the proximal side indicates a downward side in FIG. 1 or a side toward the bottom wall part 40*b*. Each of the first tapered wall part 411 and the second tapered wall part 412 has an outer surface (the exterior side surface) that is positioned further toward the exterior of the case 4 (rightward in FIG. 1) relative to an outer surface (the exterior side surface) of the end portion 410 as shown in FIG. 1. Also, each of the first tapered wall part 411 and the second tapered wall part 412 of the case 4 has an inner surface (the interior side surface) that extends generally perpendicularly to the bottom wall part 40*b*. It should be noted that in the present embodiment, the inner surface is tapered by a draft angle of about 0.5 degree such that the engagement standing part 41 is removed from a mold for casting the engagement standing part 41.

The second inclination angle is smaller than the first inclination angle. The first inclination angle is not limited to a specific value, and may be about 5 degree. Also, the second inclination angle is not limited to a specific value provided that the second inclination angle is smaller than the first inclination angle. The second inclination angle is 1 degree in the present embodiment, and may be closer to 0 degree such that the second tapered wall part 412 stands generally in the standing direction. It should be noted that in the present embodiment, each of the end portion 410 that extends in the standing direction and the second tapered wall part 412 has a draft angle of 0.5 degree such that the engagement standing part 41 is removed from a mold for casting the engagement standing part 41.

The main body portion 40 of the case 4 has female threaded parts 45 at positions that correspond to the threaded holes 20 of the circuit board 2 received in the case 4. Thus, the female threaded parts 45 are in threadably engaged with the threaded members that extend through the threaded holes 20. The circuit board 2 is fixed to the case 4 by threadably engaging the threaded member, which extends through the threaded hole 20 of the circuit board 2, with the female threaded part 45.

(Assembly Method)

The air bag ECU 1 of the present embodiment is assembled in the following manner.

Firstly, the communication connector 3 having the press-fit terminal 5 is assembled to the circuit board 2. In the above assembly, the communication connector 3 and the circuit board 2 are arranged at a position such that the press-fit terminal 5 is positioned correspondingly to the through hole 21. Thus, by displacing the communication connector 3 closer to the circuit board 2, the press-fit terminal 5 of the communication connector 3 is press-fitted into the through hole 21 of the circuit board 2.

Then, the circuit board 2 assembled with the communication connector 3 is inserted into the main body portion 40 of the case 4, and the circuit board 2 is fixed to the Main body portion 40. In a process of causing the circuit board 2 to be received within the main body portion 40 of the case 4, the circuit board 2 is inserted into the case 4 such that the communication connector 3 is fitted with the receiving part of the case 4. When the circuit board 2 is inserted into the case 4, the engagement standing part 41 is inserted into the space defined between the pair of the projections 31, 32.

When the circuit board 2 is being inserted into the case 4, firstly, the end portion 410 of the engagement standing part 41 is received in the space between the pair of the projections 31, 32 of the communication connector 3. Because a distance measured in a thickness direction of the end portion 410 between the pair of the projections 31, 32 is wider than the thickness of the end portion 410, the end portion 410 of the engagement standing part 41 is effectively guided by the pair of the projections 31, 32. Thus, even when the end portion 410 contacts the pair of the projections 31, 32, the insertion of the engagement standing part 41 is not restricted.

When the circuit board 2 is further inserted into the case 4, the engagement standing part 41 contacts each of the pair of the projections 31, 32. In the above, the projection 32 contacts the inner surface of the engagement standing part 41, and the projection 31 contacts the first tapered wall part, 411. When the circuit board 2 is still further inserted into the case 4, the deformable part 311 of the projection 31 is brought into press-contact with the first tapered wall part 411 while the inner surface of the engagement standing part 41 slides with the projection 32. As a result, the deformable part 311 deforms or elastically deforms into a shape that extends along the tapered surface of the first tapered wall part 411. Because the first tapered wall part 411 is angled by the first inclination angle, a deformation amount, by which the deformable part 311 deforms, becomes greater with the increase an insertion depth, by which the circuit board 2 is inserted into the case 4.

Figure 6:
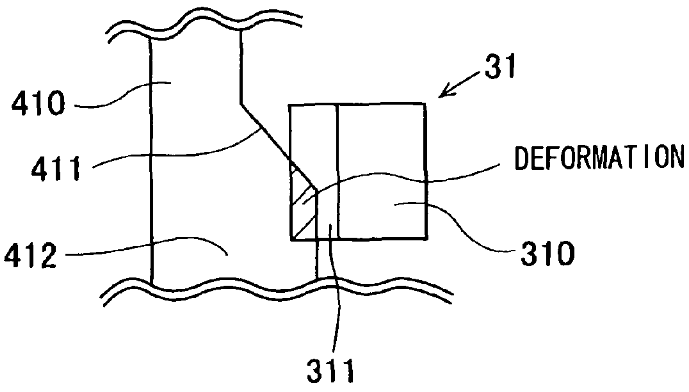
FIG. 6 is a enlarged diagram of a part VI shown in FIG. 1 for illustrating deformation of a deformable part of the projection in the manufacturing of the air bag ECU according to the one embodiment.

When the circuit board 2 is still further inserted into the case 4, the deformable part 311 of the projection 31 is brought into press-contact with the second tapered wall part 412 as shown in FIG. 6. Because the second tapered wall part 412 is angled by a smaller inclination angle compared with the first tapered wall part 411 as described above, the increase in the deformation amount of the deformable part 311 is effectively limited in a state, where the deformable part 311 of the projection 31 is in press-contact with the second tapered wall part 412.

As above, the circuit board 2 is inserted into the case 4. Then, by threadably engaging the threaded member, which extends through the threaded hole 20 of the circuit board 2, with the female threaded part 45, the circuit board 2 is fixed to the case 4. Then, the opening of the case 4 is covered with the cap portion (not shown). Thus, the air bag ECU 1 of the present embodiment is manufactured.

Comparison Example

Figure 7:
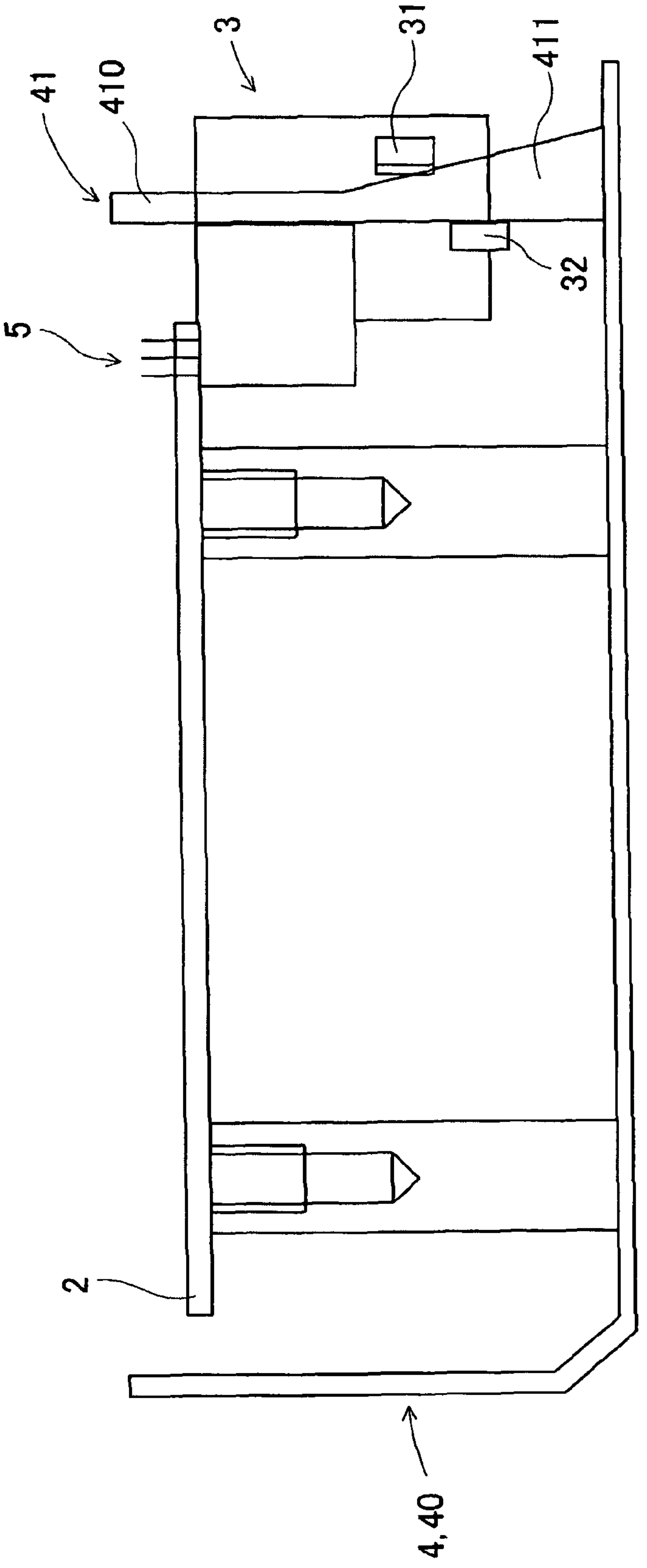
FIG. 7 is a cross-sectional view of a configuration of an air bag ECU according to a comparison example.

A cross-sectional view of a configuration of an air bag ECU of a comparison example is shown in FIG. 7. The air bag ECU of the present comparison example is similar to the air bag ECU of the above embodiment, except that the engagement standing part 41 of the present comparison example does not have the second tapered wall part of the above embodiment. Specifically, the engagement standing part 41 has an end portion 410 and a first tapered wall part 411. The end portion 410 has a thickness that is constant in the standing direction, in which the engagement standing part 41 extends. The first tapered wall part 411 is provided at a proximal side of the end portion 410, and is angled by a first inclination angle relative to the standing direction.

Advantages of Embodiment

Figure 8:
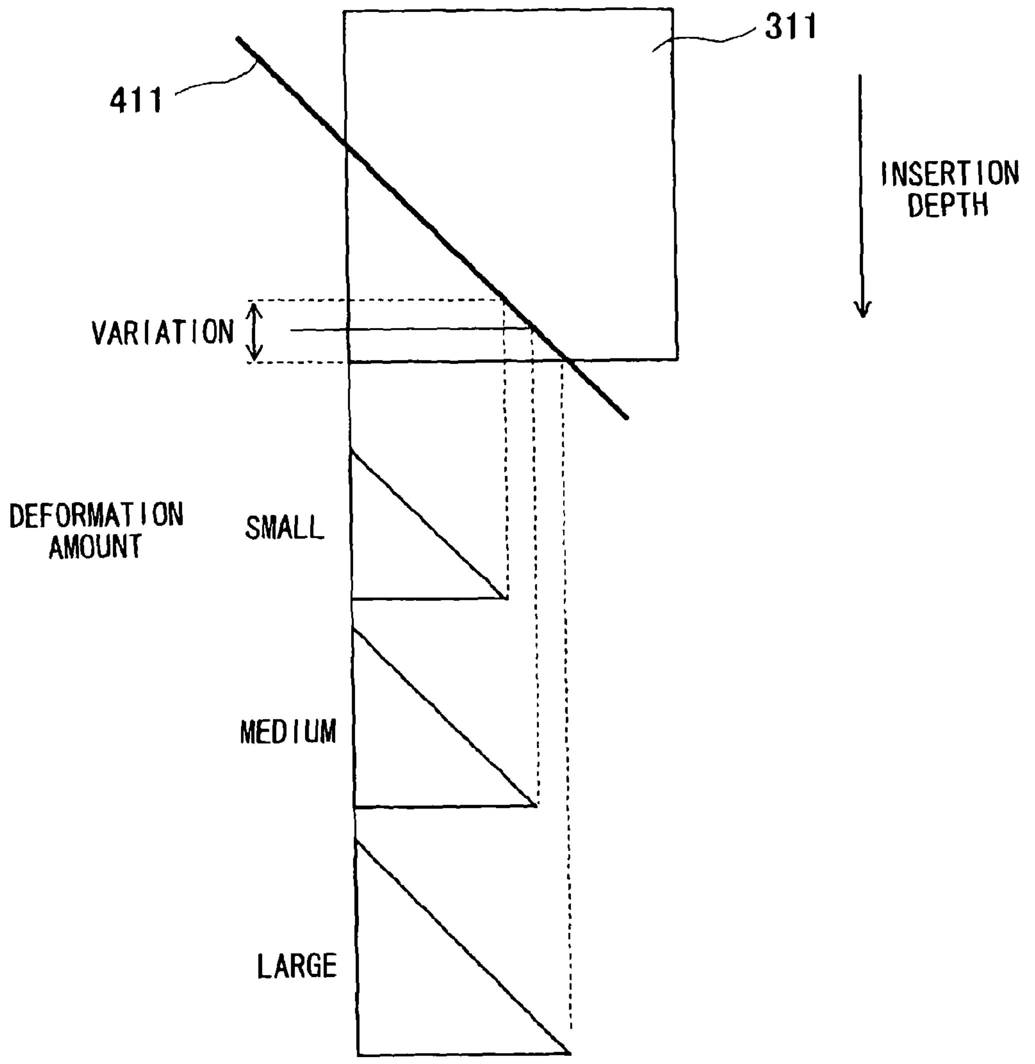
FIG. 8 is a diagram illustrating a deformation amount of the deformable part of the projection in the manufacturing of the air bag ECU of the comparison example.

In the air bag ECU 1 of the comparison example, when the circuit board 2 is inserted into the case 4, the deformation amount, by which the deformable part 311 of the projection 31 is deformed, becomes greater with the increase of the insertion depth, by which the circuit board 2 assembled with the communication connector 3 is inserted as shown in FIG. 8. In other words, accuracy in assembly of the communication connector 3 to the circuit board 2 deteriorates, and thereby a distance measured in the insertion direction between the circuit board 2 and the projection 31 varies. As a result, the deformation amount of the deformable part 311 of the projection 31 varies. The deformation amount of the deformable part 311 is proportional to a force required to insert the engagement standing part 41 between the pair of the projections 31, 32. Thus, when the deformation amount of the deformable part 311 varies in different products, the force required in the process for inserting the circuit board 2 (the communication connector 3) into the case 4 or into the receiving part of the case 4 also varies. Furthermore, when the circuit board 2 (the communication connector 3) is inserted into the case 4 or the receiving part of the case 4 substantially deeper, a large amount of force is required. Thus, the operability of the assembly of the air bag ECU 1 of the comparison example deteriorates due to the variation of the force required in the assembly process.

Figure 9:
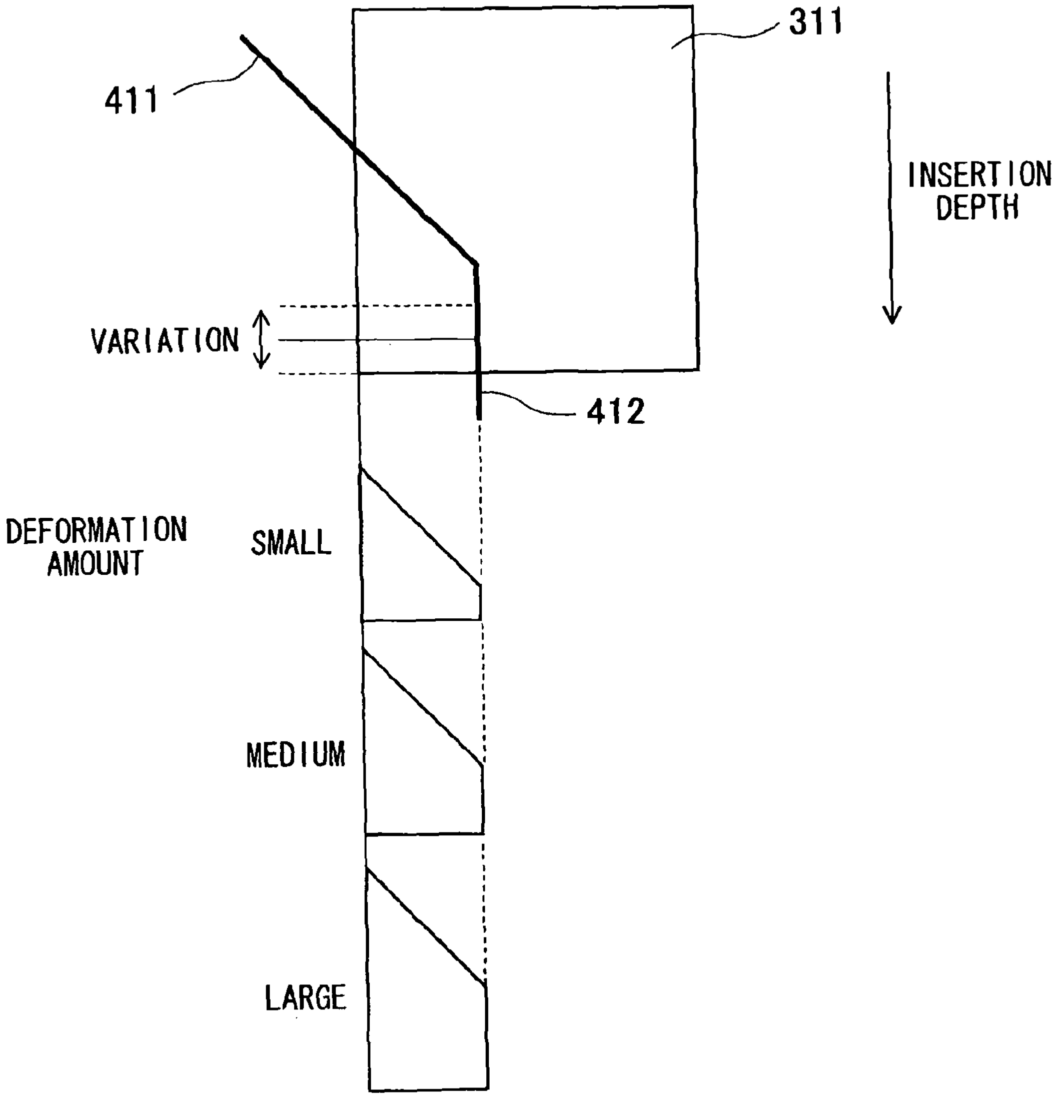
FIG. 9 is a diagram illustrating the deformation amount of the deformable part of the projection in the manufacturing of the air bag ECU of the one embodiment.

In contrast, in the air bag ECU 1 of the present embodiment, the engagement standing part 41 has the first tapered wall part 411 and the second tapered wall part 412. As a result, when the circuit board 2 (the communication connector 3) is inserted into the case 4 or the receiving part of the case 4 more deeply, as shown in FIG. 9, the deformable part 311 is brought into press-contact with the second tapered wall part 412 after being in press-contact with the first tapered wall part 411. Therefore, the increase in the deformation amount of the deformable part 311 is successfully limited, and thereby excessive force is not required advantageously. In other words, when the deformable part 311 is in press-contact only with the second tapered wall part 412, it is possible to keep the deformation amount constant, and thereby excessive force is not required advantageously. When the deformation amount of comparison example shown in FIG. 8 is compared with the deformation amount of the present embodiment shown in FIG. 9, it is appreciated that the deformation amount of the present embodiment is smaller than the deformation amount of comparison example even for the same insertion depth. Thus, the operability in the assembly of the air bag ECU 1 of the present embodiment is facilitated, and it is possible to precisely and easily assemble the air bag ECU 1.

Although the air bag ECU 1 of the present embodiment employs the press-fit terminal 5 that may have poor accuracy in positioning for assembly of the communication connector 3 to the circuit board 2, it is possible to achieve the assembly with high accuracy and easiness as above.

In the present embodiment, because the projection 31 has the main body portion 310 and the deformable part 311, the deformable part 311 deforms when the projection 31 is brought into press-contact with the first tapered wall part 411 and the second tapered wall part 412. The generated deformation exerts stress, and the exerted stress serves as a press-contact force between the projection 31 and the tapered wall parts 411, 412. As a result, the element 3 is fixed to the base body 4.

In the present embodiment, because the end portion of the deformable part 311 is narrowed toward the end of the deformable part 311, the projection 31 is more likely to deform when the projection 31 is in press-contact with the engagement standing part 41. Also, the narrowed end shape facilitates the adjustment of the press-contact force.

In the present embodiment, because the projection 31 is made of the resin that is softer than the metal of the engagement standing part 41, only the projection 31 is deformed when the projection 31 is brought into press-contact with the tapered wall parts 411, 412.

In the present embodiment, in the assembly of the element 3 to the base body 4, the press-contact force between the projection 31 and the tapered wall part 411, 412 is effectively adjusted. As a result, even when the element 3 is located at a different position relative to the tapered wall part 411, 412, the excessive press-contact force is not required. As a result, in the assembly of the base body 4 and the element 3, the increase of cost required for the assembly is limited advantageously.

MODIFICATION

In the embodiment, although the engagement standing part 41 has two tapered walls (the first and second tapered wall parts 411, 412), one or more tapered wall part may be additionally formed at the proximal side of the second tapered wall part 412. For example, a third tapered wall part and a fourth tapered wall part may be formed at the proximal side of the second tapered wall part 412. In the above case, the inclination angles of the tapered walls become smaller as a function of a distance from the first tapered wall part 411 toward the proximal side (toward the bottom wall part 40*b*).

Also, in the above embodiment, each of the first and second tapered wall parts 411, 412 of the engagement standing part 41 has a flat tapered surface. However, the tapered surface of the first and second tapered wall part 411, 412 may be curved alternatively. In a case of the curved tapered surface, the inclination angle is defined based on a direction, in which a tangential line of the curved tapered surface extends.

Further, in the above embodiment, the tapered surfaces of the first and second tapered wall parts 411, 412 of the engagement standing part 41 are formed on the exterior side of the case 4. However, the tapered surfaces of the first and second tapered wall parts 411, 412 may be alternatively formed on the interior side of the case 4.

Additional advantages and modifications will readily occur to those skilled in the art. The invention in its broader terms is therefore not limited to the specific details, representative apparatus, and illustrative examples shown and described.

What is claimed is:

1. A circuit device comprising:

an element having a pair of projections that are spaced apart from each other by a predetermined interval on an outer peripheral surface of the element; and a base body that has an engagement standing part extending in a standing direction and provided, between the pair of projections, wherein:

the engagement standing part has contact surfaces that face in opposite directions;

the element is assembled to the base body in a state, where each of the contact surfaces of the engagement standing part is in press-contact with a corresponding one of the pair of projections;

the engagement standing part has a first tapered wall part and a second tapered wall part that is provided on a side of the first tapered wall part;

the first tapered wall part has a first tapered surface that is angled by a first inclination angle relative to the standing direction of the engagement standing part;

the second tapered wall part has a second tapered surface that is angled by a second inclination angle relative to the standing direction;

the second inclination angle is smaller than the first inclination angle;

one of the pair of projections is in press-contact with at least one of the first tapered surface and the second tapered surface; and the one of the pair of projections is deformed.

2. The circuit device according to claim 1, wherein:

the engagement standing part of the base body is inserted into the a pair of projections in an insertion direction that is equivalent to the standing direction.

3. The circuit device according to claim 1, wherein:

the one of the pair of projections includes:

a main body portion that projects from the outer peripheral surface of the element; and a deformable part that is deformably provided to a side surface of the main body portion; and the deformable part is spaced apart from the outer peripheral surface.

4. The circuit device according to claim 3, wherein:

the deformable part has an end portion that contacts the engagement standing part; and the end portion of the deformable part is narrowed toward an end of the end portion.

5. The circuit device according to claim 1, wherein:

each of the pair of the projections is made of a resin; and the engagement standing part is made of a metal.

6. The circuit device according to claim 1, wherein:

the element is a connector element that is assembled to a circuit board.

7. The circuit device according to claim 1, wherein:

the element is assembled to the circuit board through a press-fit element.

8. The circuit device according to claim 1, wherein:

the base body serves as a case that receives therein the circuit board.

9. The circuit device according to claim 8, wherein:

the engagement standing part corresponds to a peripheral edge part that defines a receiving part opening at the case; and the receiving part receives the connector element.

10. The circuit device according to claim 1, wherein:

the circuit device is an electronic control unit mounted on a vehicle.

11. The circuit device according to claim 1, wherein:

the base body has a bottom wall part, from which the engagement standing part extends; and the second tapered wall part is provided between the first tapered wall part and the bottom wall part of the base body.

12. A circuit device comprising:

an element that has a pair of projections, which are spaced apart from each other by a predetermined interval, and which are deformably formed on an outer peripheral surface of the element; and a base body that has an engagement standing part extending in a standing direction, wherein:

the engagement standing part has contact surfaces that face in opposite directions;

each of the contact surfaces is in press-contact with a corresponding one of the pair of projections such that the corresponding one of the pair of projections is deformed;

the engagement standing part has a first tapered wall part and a second tapered wall part that is provided on a side of the first tapered wall part;

the first tapered wall part has a first tapered surface that is angled by a first inclination angle relative to the standing direction of the engagement standing part;

the second tapered wall part has a second tapered surface that is angled by a second inclination angle relative to the standing direction; and the second inclination angle is smaller than the first inclination angle.

13. A method for manufacturing a circuit device that has an element and a base body, wherein:

the element has a pair of projections, which are spaced apart from each other by a predetermined interval, and which are deformably formed at an outer peripheral surface of the element; and the base body has an engagement standing part extending in a standing direction, the engagement standing part having a first tapered wall part and a second tapered wall part that is provided at a side of the first tapered wall part, the first tapered wall part having a first tapered surface angled by a first inclination angle relative to the standing direction of the engagement standing part, the second tapered wall part having a second tapered surface angled by a second inclination angle relative to the standing direction, the second inclination angle being smaller than the first inclination angle, the method comprising:

displacing the element relative to the base body such that the engagement standing part is inserted into a apace defined between the pair of projections; and assembling the element to the base body by causing the engagement standing part to deform one of the pair of projections.

* * * * *